United States Patent
Harvey

(10) Patent No.: US 7,557,659 B2
(45) Date of Patent: Jul. 7, 2009

(54) SLEW-ENHANCED INPUT STAGES AND AMPLIFIERS

(75) Inventor: Barry Harvey, Los Altos, CA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 11/940,933

(22) Filed: Nov. 15, 2007

(65) Prior Publication Data

US 2009/0102560 A1    Apr. 23, 2009

Related U.S. Application Data

(60) Provisional application No. 60/981,419, filed on Oct. 19, 2007.

(51) Int. Cl.
*H03F 3/45* (2006.01)
(52) U.S. Cl. .................................. 330/255; 330/257
(58) Field of Classification Search .......... 330/255, 330/257, 261, 258
See application file for complete search history.

(56) References Cited

U.S. PATENT DOCUMENTS

| | | | | |
|---|---|---|---|---|
| 6,316,998 B1 * | 11/2001 | Oikawa | ................. | 330/255 |
| 7,009,450 B2 * | 3/2006 | Parkhurst et al. | ............. | 330/255 |
| 7,271,653 B2 * | 9/2007 | Chung | ................. | 330/255 |
| 7,330,074 B2 * | 2/2008 | Kang et al. | ................. | 330/255 |

* cited by examiner

*Primary Examiner*—Henry K Choe
(74) *Attorney, Agent, or Firm*—Fliesler Meyer LLP

(57) ABSTRACT

Provided herein are input stages, and operation amplifiers including input stages. In an embodiment, an input stage includes a complimentary differential input transconductor, first and second npn-pnp current mirrors, and first and second pnp-npn current mirrors. The complimentary differential input transconductor includes a pair of differential inputs that accept a pair of voltage signals, a first pair of complimentary differential outputs that output current signals I1 and I2, and a second pair of complimentary differential outputs that output current signals I3 and I4. Each current mirror accepts one of the current signals I1, I2, I3 and I4, and outputs a pair of current signals (e.g., I1' and I1") that are proportional to the accepted current signal (e.g., I1). Current signals I1' and I3' are added to produce a first output current (Iout) of the input stage. Current signals I2' and I4' are added to produce a second output current (Iout_bar) of the input stage.

19 Claims, 9 Drawing Sheets

SLEW-ENHANCED INPUT STAGES AND AMPLIFIERS

PRIORITY CLAIM

This application claims priority under 35 U.S.C. 119(e) to U.S. Provisional Patent Application No. 60/981,419, filed Oct. 19, 2007, which is incorporated herein by reference.

FIELD OF THE INVENTION

Embodiments of the present invention relate to input stage circuits and operation amplifiers that include input stage circuits.

BACKGROUND

Slew-enhanced operational amplifiers have input stages that operate in class-AB mode such that the available slew currents are independent of and not limited by quiescent currents. FIG. 1 is a simplified schematic of an exemplary slew-enhanced input stage 102 combined with a classic rail-to-rail output stage 104. The input stage 102 includes transistors Q101-Q108, current mirrors 126 and 128, a number of current sources, and a resistor Rgm. The current mirror 126 is made up of pnp transistors. The current mirror 128 is made up of npn transistors. The output stage 104 includes transistors Q109-Q118, compensation capacitors CCP and CCN, and a current source. While the currents produced by the current sources in a FIG. 1 and the remaining FIGS. are shown as producing quiescent current Iq, other current values are also possible. Additionally, all the various current sources in a same FIG. need not produce the same current.

The input stage 102 is a typical class-AB type, where the differential current through the resistor Rgm can be much larger than quiescent current Iq. One of each pair of differential currents sent toward ground and Vs are returned through current mirrors 126 and 128 and merged with the other current and made single-ended by the output stage 104. These combined currents represent the difference of the +input (+IN) to −input (−IN) and are sent to the bases of the output transistors Q117 and Q118. The collectors of the output transistors Q117 and Q118 join to form the output terminal. The eight transistors Q109-Q116 connected to the bases of the output transistors Q117 and Q118 are for biasing the output transistors Q117 and Q118 to a known quiescent current and controlling the crossover between the output transistors Q117 and Q118. All this circuitry is well-known.

The circuit of FIG. 1 has several drawbacks. One is that the open-loop gain diminishes badly with output loading. When an output transistor Q117 and/or Q118 drives output current, it will require base current which is ultimately derived from an error voltage across the resistor Rgm. Ultimately, this will limit gain to around 30 with a 150% load and typical values for resistor Rgm. Because npn and pnp betas are generally unequal, there will also be nonlinearity between + and − output signals. There needs to be more beta between the input transconductance (gm) and the output.

Another drawback of the circuit of FIG. 1 is that the input signals cannot linearly go less than about a volt above the low voltage rail (e.g., ground or −Vs). Here, the low voltage rail will be presumed to be ground. In single supply circuits, complying with ground-level signals is virtuous.

SUMMARY

Specific embodiments of the present invention relate to input stages, and operational amplifiers that include input stages. In accordance with an embodiment, an inputs stage includes a complimentary differential input transconductor, first and second npn-pnp current mirrors, and first and second pnp-npn current mirrors. The complimentary differential input transconductor includes a pair of differential inputs that accept a pair of voltage signals, a first pair of complimentary differential outputs that output current signals I1 and I2, and a second pair of complimentary differential outputs that output current signals I3 and I4.

The first npn-pnp current mirror has an input and a pair of outputs, the input accepting the current signal I1, and the pair of outputs outputting current signals I1' and I1" that are proportional to the current signal I1. The second npn-pnp current mirror has an input and a pair of outputs, the input accepting the current signal I2, and the pair of outputs outputting current signals I2' and I2" that are proportional to the current signal I2. The first pnp-npn current mirror has an input and a pair of outputs, the input accepting the current signal I3, and the pair of outputs outputting current signals I3' and I3" that are proportional to the current signal I3. The second pnp-npn current mirror has an input and a pair of outputs, the input accepting the current signal I4, and the outputs outputting current signals I4' and I4" that are proportional to the current signal I4. The current signals I1' and I3' are added to produce a first output current (Iout) of the input stage. The current signals I2' and I4' are added to produce a second output current (Iout_bar) of the input stage.

In accordance with specific embodiments, to reduce non-linearities between the npn-pnp current mirrors and the pnp-npn current mirrors, the current signals I1" and I2" output by the first and second npn-pnp current mirrors are provided to the second and first pnp-npn current mirrors. Similarly, the current signals I3" and I4" output by the first and second pnp-npn current mirrors are provided to the second and first npn-pnp current mirrors.

In accordance with specific embodiments, a first common-mode control current is used to increase in tandem sourcing magnitudes of the first and second output currents (Iout and Iout_bar) of the input stage. Additionally, a second common-mode control current is used to increase in tandem sinking magnitudes of the first and second output currents (Iout and Iout_bar) of the input stage. Stated another way, the first and second common-mode control currents are used to keep the common-mode of Iout and Iout_bar at a substantially zero quiescent current. Without such control currents, it's likely that the outputs of the input stage will drift toward one of the voltage rails, adversely affecting Iout and Iout_bar.

In accordance with specific embodiments, the first and second common-mode control currents are produced by a common-mode transconductance stage that provides the first and second common-mode control currents to the input stage in response to a monitoring of the common-mode voltage, determined based on the first and second output currents (Iout and Iout_bar) of the input stage, to adjust the common-mode voltage to substantially equal a common-mode reference voltage.

An operation-amplifier, according to an embodiment of the present invention, includes an input stage as described above, a common-mode transconductance stage, and an output stage. The output stage receives the first and second output currents (Iout and Iout_bar) of the input stage and based thereon determines a common-mode voltage. The common-mode transconductance stage produces and provides first and second common-mode control currents to the input stage to adjust the common-mode voltage to substantially equal the common-mode reference voltage.

Further and alternative embodiments, and the features, aspects, and advantages of the embodiments of invention will become more apparent from the detailed description set forth below, the drawings and the claims.

DETAILED DESCRIPTION

Figure 1:
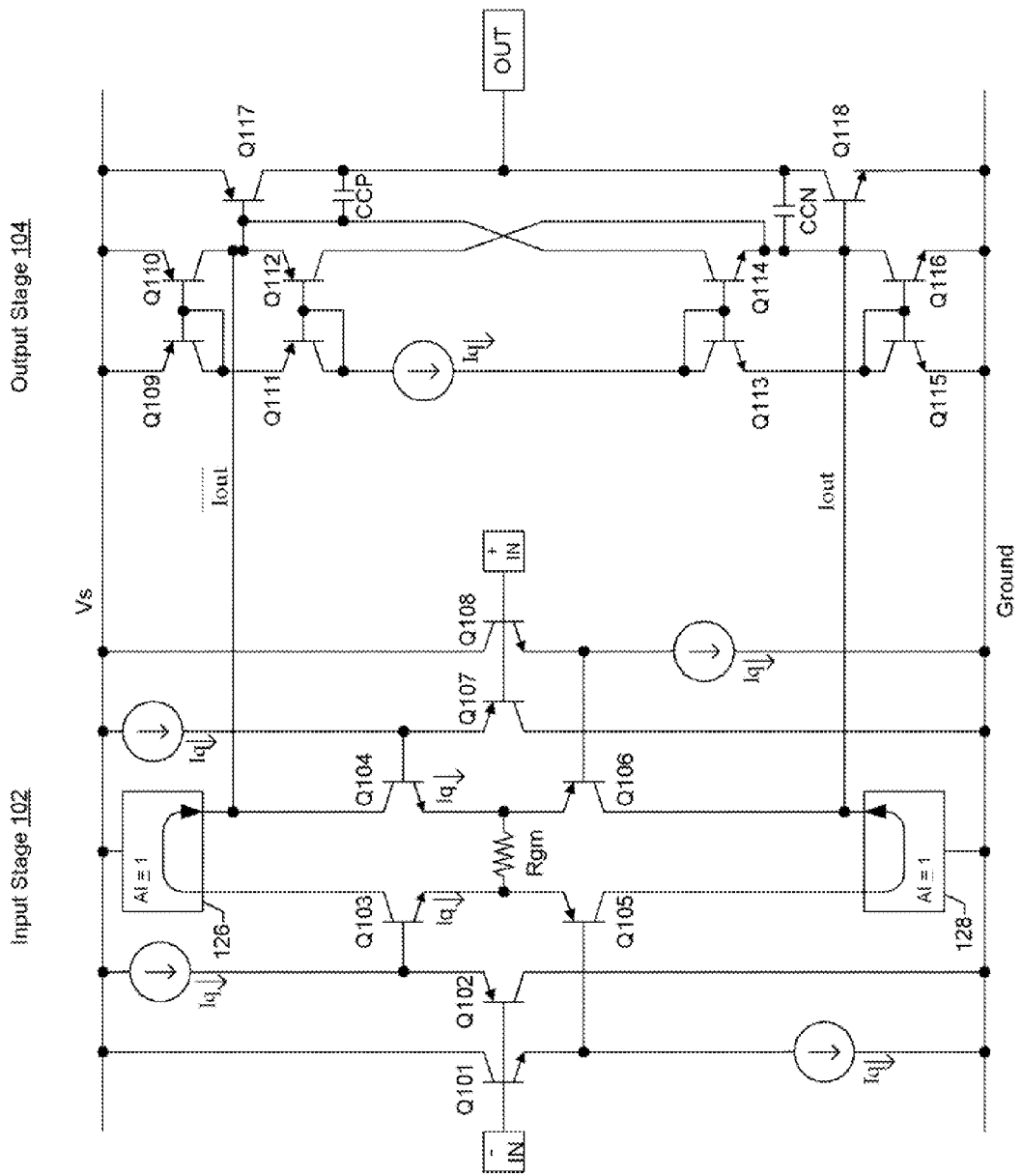
FIG. 1 is a circuit diagram of an exemplary slew-enhanced input stage combined with a classic rail-to-rail output stage.
Figure 2:
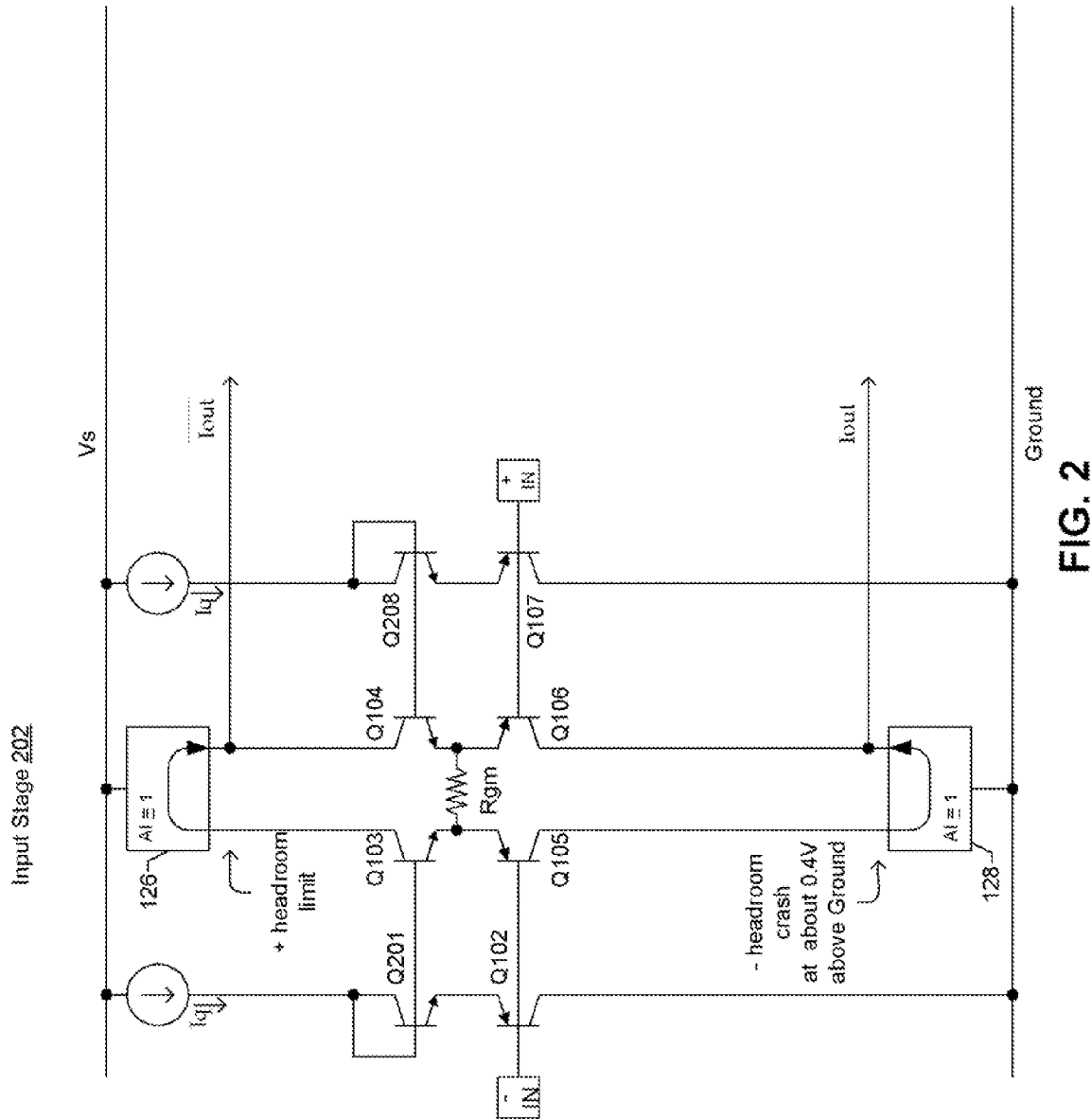
FIG. 2 is a circuit diagram of an alternative slew-enhanced input stage.

FIG. 2 shows some improvements over the input stage circuitry of FIG. 1. The input stage 202 (of FIG. 2) is similar to the input stage 102 (of FIG. 1), but with transistors Q101 and Q108 being replaced with transistors Q201 and Q208 in FIG. 2. Additionally, in FIG. 2 (as compared to FIG. 1), there are some changes in the ways that transistors Q102, 103 and 105 are connected to one another, and there are some changes in the ways transistors Q104, Q106 and Q107 are connected to one another.

Figure 3:
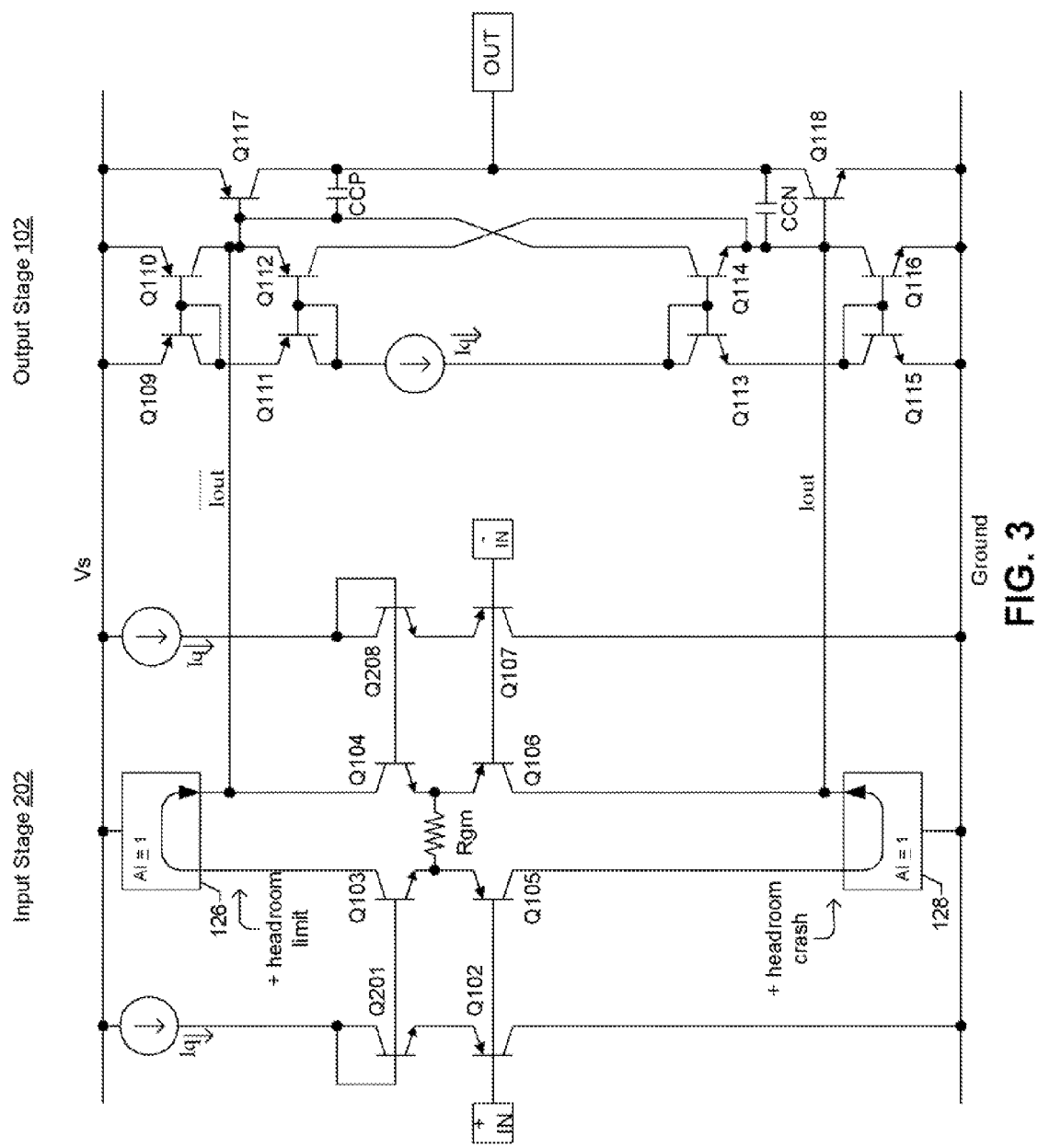
FIG. 3 is a circuit diagram of a slew enhanced amplifier, which includes the alternative input stage of FIG. 2 replacing the input stage of FIG. 1, with the output stage of FIG. 1.

In FIG. 2, the input stage 202 can more closely comply with signals toward ground (and more generally, toward the low voltage rail). The major compliance limitation would be the lower current mirror 128, which would drop at least a diode voltage (also referred to as a base to emitter voltage drop, forward voltage drop, or simply Vbe), thus saturating the pnp transistors Q105 and Q106 of the input stage 202. FIG. 3 shows the input stage 202 of FIG. 2 connected to the output stage 102 of FIG. 1.

Figure 4:
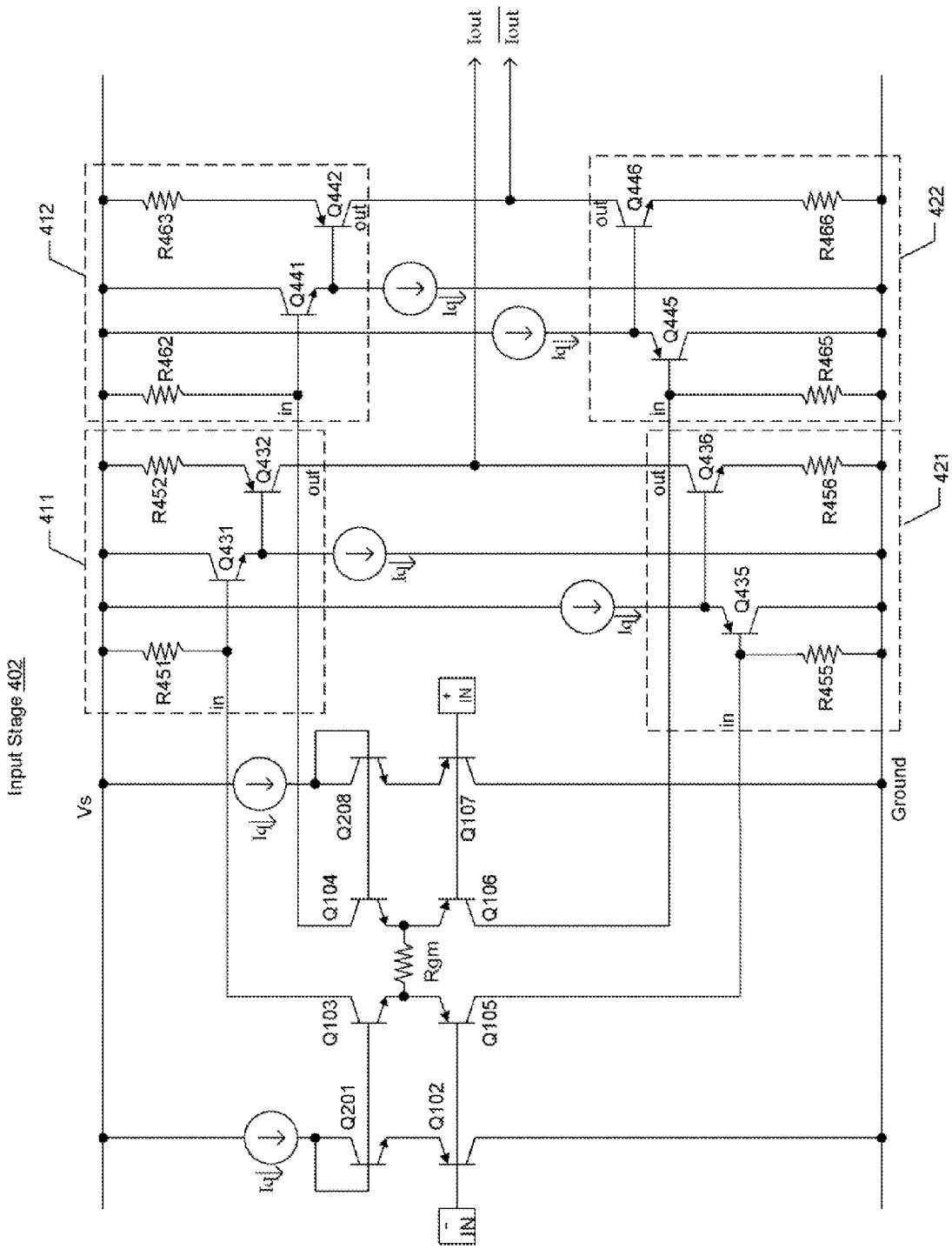
FIG. 4 is a circuit diagram of a further slew enhanced input stage.

FIG. 4 shows an input stage 402 that fixes the compliance limitation problem of the input stage 202 of FIG. 2 (and FIG. 3). In FIG. 4, the current mirrors 411 and 412 are npn-pnp type current mirrors, and the current mirrors 421 and 422 are pnp-npn type current mirrors. As the terms are used herein, an npn-pnp current mirror uses the base of an npn emitter-follower as its input, and the collector of a pnp as its output. In contrast, a pnp-npn current mirror uses the base of a pnp emitter-follower as its input and the collector of a npn as its output. Such current mirrors are examples of mixed transistor type current mirrors, in that they include both npn and pnp transistors.

The emitter follower transistor of each mirror (e.g., Q435 of mirror 421) simply level-shifts the input a diode voltage away from the corresponding supply rail, and the output transistor (e.g., Q436 of mirror 421) outputs a current proportional to the input current dropping a voltage across the input resistor of the mirror (e.g., across input resistor R455 of mirror 421). By dropping their load current only across input resistors and no full diode voltage, the input pnp transistors (e.g., pnp transistor Q435 of mirror 421, and pnp transistor Q445 of mirror 422) can accept input voltages (−IN and +IN) all the way to ground. The quiescent drop on the resistors at the pnp loads would be typically about 150 mV.

Unfortunately, npn-pnp and pnp-npn current mirrors are inaccurate current mirrors. The Vbe of npn transistors' is not correlated to that of the pnp transistors', so there is a large offset potential. Further, the emitter current of the output transistors (e.g., Q436 of mirror 421) varies with signal but the emitter current of the emitter follower transistor (e.g., Q435 of mirror 421) does not, giving large non-linearities. For this reason, a single +supply and a single −supply mirror is not used (as was the case in FIG. 1). Rather, in FIG. 4, four npn-pnp mirrors 411, 421, 412 and 422 are used, each mirroring one of the four input transistor error currents. The differential to single-ended conversion can be done by subsequent circuitry (e.g., by output stage 104, but not limited thereto).

In FIG. 4, the left-to-right matching of the pairs of current mirrors (e.g., current mirrors 411 to 412) is very good, even though up-to-down pair matching (e.g., current mirrors 411 to 421) is not. Thus, the Iout and Iout_bar signals have a low potential differential offset, although they each have a relatively large common-mode error, which is undesirable.

Figure 5:
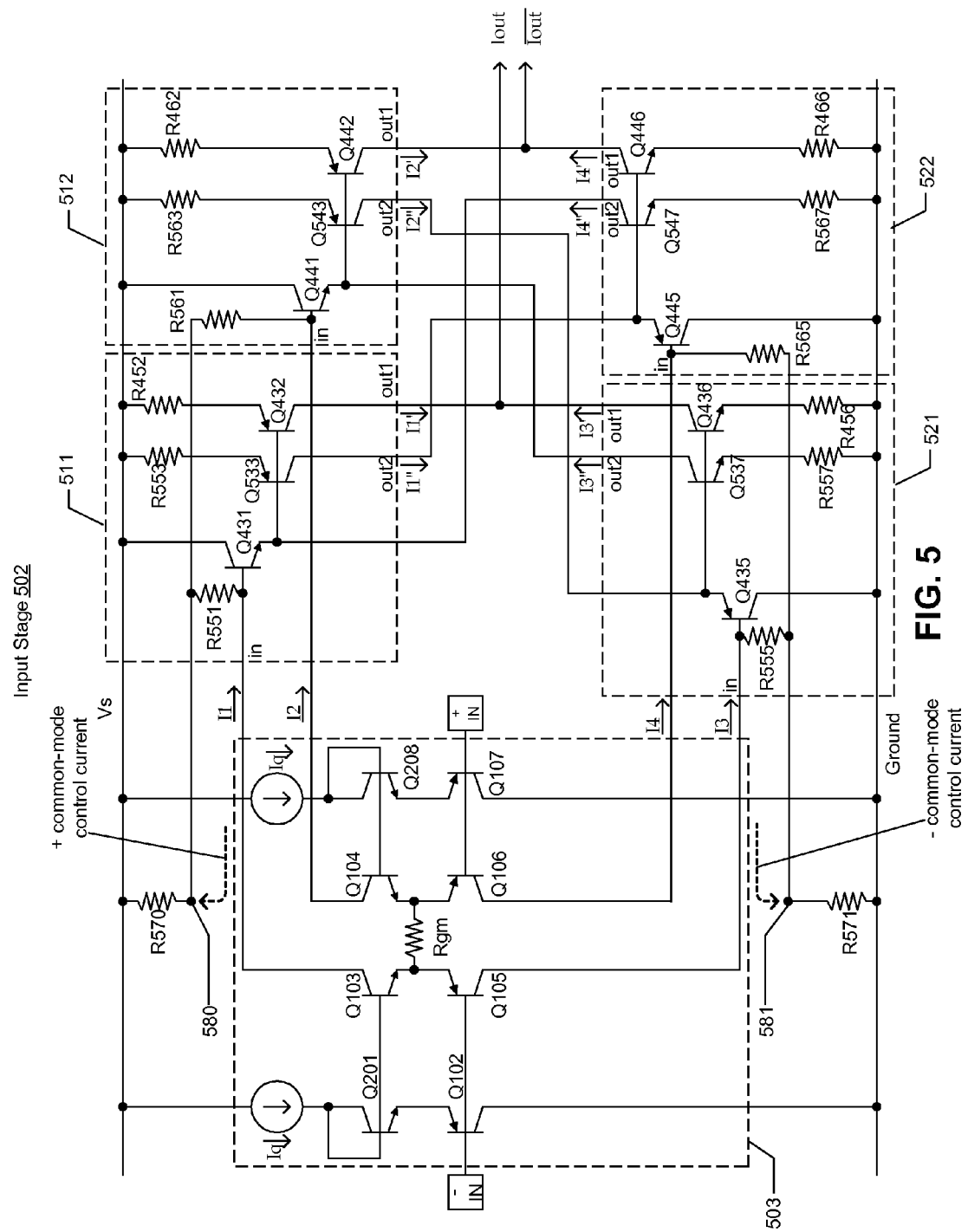
FIG. 5 is a circuit diagram of still another slew enhanced input stage.

FIG. 5 shows an input stage 502 that includes some enhancements to the input stage 402 of FIG. 4. In FIG. 5, a first improvement is in forming a second output (labeled "out2") from each mixed transistor type current mirror (which in an embodiment is at a smaller scale of that current), and guiding it to an appropriate terminal of an emitter-follower of another mixed transistor type current mirror. This results in dynamic output currents that replace the static output currents in the current mirrors of FIG. 4. In FIG. 5, these currents follow in scale the current that the output transistor of the mirror, such that both input and output transistors operate at dynamically changing currents that are always a constant scale of each other. This improves signal linearity. It also dynamically increases current into the emitter-follower at the same moment that its driven output transistor dynamically increases its output current. This allows for a high ratio of peak to dynamic signal currents.

Another improvement is accomplished by adding resistors R570 and R571, each in series with the supply return of the mirror input resistors, which allow injection of common-mode correction currents (also referred to as common-mode control currents) that do not cause differential errors. For instance, if the outputs were at too high a common-mode voltage, a control current (i.e., a "− common-mode control current") could be sourced into the − common-mode control current point 581 to increase output pull-down current.

Some additional details of FIG. 5 will now be provided. Referring to FIG. 5, the input stage 502 is shown as including a complimentary differential input transconductor 503, npn-pnp current mirrors 511 and 512, and pnp-npn current mirrors 521 and 522. The complimentary differential input transconductor 503 includes a pair of differential inputs that accept a pair of voltage signals, a first pair of complimentary differential outputs that output current signals I1 and I2, and a second pair of complimentary differential outputs that output current signals I3 and I4. The specific arrangement of transistors Q201, Q102-107 and Q208 shown in FIG. 5 is a preferred embodiment for the complimentary differential output transconductor 503. Nevertheless, alternative configurations of the complimentary differential output transconductor 503 are also within the scope of the present invention, where such alternative configurations provide similar inputs and outputs.

Still referring to FIG. 5, each of the mixed transistor type current mirrors 511, 512, 521 and 522 has an input and a pair of outputs. More specifically, the npn-pnp current mirrors 511 and 512 each includes an npn emitter-follower transistor (i.e., Q431 and Q441, respectively) having a base that forms the input of the current mirror, a collector connected to a high voltage rail (Vs), and an emitter connected to bases of two pnp output transistors. The pnp output transistors of the npn-pnp current mirror 511 are transistors Q432 and Q533. The pnp output transistors of the npn-pnp current mirror 512 are transistors Q442 and Q543. Collectors of the two pnp output transistors of each npn-pnp current mirror form the pair of outputs of the npn-pnp current mirrors.

The pnp-npn current mirrors 521 and 522 each includes a pnp emitter-follower transistor (i.e., Q435 and Q445, respectively) having a base that forms the input of the current mirror, a collector connected to a low voltage rail (e.g., ground or −Vs), and an emitter connected to bases of two npn output transistors. The npn output transistors of the pnp-npn current mirror 521 are transistors Q436 and Q537. The npn output transistors of the pnp-npn current mirror 522 are transistors Q446 and Q547. Collectors of the two npn output transistors of each pnp-npn current mirror form the pair of outputs of the pnp-npn current mirrors.

The npn-pnp current mirror 511 accepts at its input the current signal I1, and outputs current signals I1' and I1" that are proportional to the current signal I1. The npn-pnp current mirror 512 accepts at its input the current signal I2, and outputs current signals I2' and I2" that are proportional to the current signal I2. The pnp-npn current mirror 521 accepts at its input the current signal I3, and outputs current signals I3' and I3" that are proportional to the current signal I3. The pnp-npn current mirror 522 accepts at its input the current signal I4, and outputs current signals I4' and I4" that are proportional to the current signal I4.

As can be seen in FIG. 5, the current signals I1' and I3' are added to produce a first output current (Iout) of the input stage 502. Similarly, the current signal I2' and I4' are added to produce the second output current (Iout_bar) of the input stage 502.

As mentioned above, in the discussion of FIG. 4, in general a problem with npn-pnp and pnp-npn current mirrors is their large non-linearities, due to their mixing of static and dynamic operating currents. The input stage 502 of FIG. 5 reduces the non-linearities between such mixed transistor type current mirrors. This is accomplished by providing the current signals I1" and I2" output by the npn-pnp current mirrors 511 and 512 to the pnp-npn current mirrors 522 and 521, and by providing the current signals I3" and I4" output by the pnp-npn current mirrors 521 and 522 to the npn-pnp current mirrors 512 and 511, as shown in FIG. 5. More specifically, the current signal I1", output by one of the outputs of the npn-pnp current mirror 511, is provided to the emitter of the pnp transistor Q445 whose base forms the input of the pnp-npn current mirror 522. Similarly, the current signal I2", output by one of the outputs of the npn-pnp current mirror 512, is provided to the emitter of the pnp transistor Q435 whose base forms the input of the pnp-npn current mirror 521. Additionally, the current signal I3", output by one of the outputs of the pnp-npn current mirror 521, is provided to the emitter of the npn transistor Q441 whose base forms the input of the npn-pnp current mirror 512. Further, the current signal I4", output by one of the outputs of the pnp-npn current mirror 522, is provided to the emitter of the npn transistor Q431 whose base forms the input of the first npn-pnp current mirror 511.

In FIG. 5, the resistor R570 has a terminal connected to the high voltage rail (Vs) and another terminal connected to terminals of resistors R551 and R561. Similarly, the resistor R571 has a terminal connected to the low voltage rail (e.g., ground or −Vs) and another terminal connected to terminals of resistors R555 and R565. The resistor R551, which is shown as being part of the npn-pnp current mirror 511, is connected between a terminal of the resistor R570 and the base of the npn transistor Q431 that forms the input of the npn-pnp current mirror 511. The resistor R561, which is shown as being part of the npn-pnp current mirror 512, is connected between a terminal of the resistor R570 and the base of the npn transistor Q441 that forms the input of the npn-pnp current mirror 512. The resistor R555, which is shown as being part of the pnp-npn current mirror 521, is connected between a terminal of the resistor R571 and the base of the pnp transistor Q435 that forms the input of the pnp-npn current mirror 521. The resistor R565, which is shown as being part of the pnp-npn current mirror 522, is connected between a terminal of the resistor R571 and the base of the pnp transistor Q445 that forms the input of the pnp-npn current mirror 522.

The common terminal of the resistors R570, R551 and R561 (i.e., the terminal of the resistor R570 not connected to the high voltage rail) is provided with a + common-mode control current to increase in tandem Iout and Iout_bar sourcing magnitudes. Such point is labeled control node 580. The common terminal of the resistors R571, R555 and R565 (i.e., the terminal of the resistor R571 not connected to the low voltage rail) is provided with − common-mode control current to increase in tandem Iout and Iout_bar sinking magnitudes. Such point is labeled control node 581. Stated another way, the first and second common-mode control currents are used to keep the common-mode of Iout and Iout_bar at a substantially zero quiescent current. Without such control currents, it's likely that the outputs of the input stage 502 will drift toward one of the voltage rails, adversely affecting Iout and Iout_bar.

Figure 6:
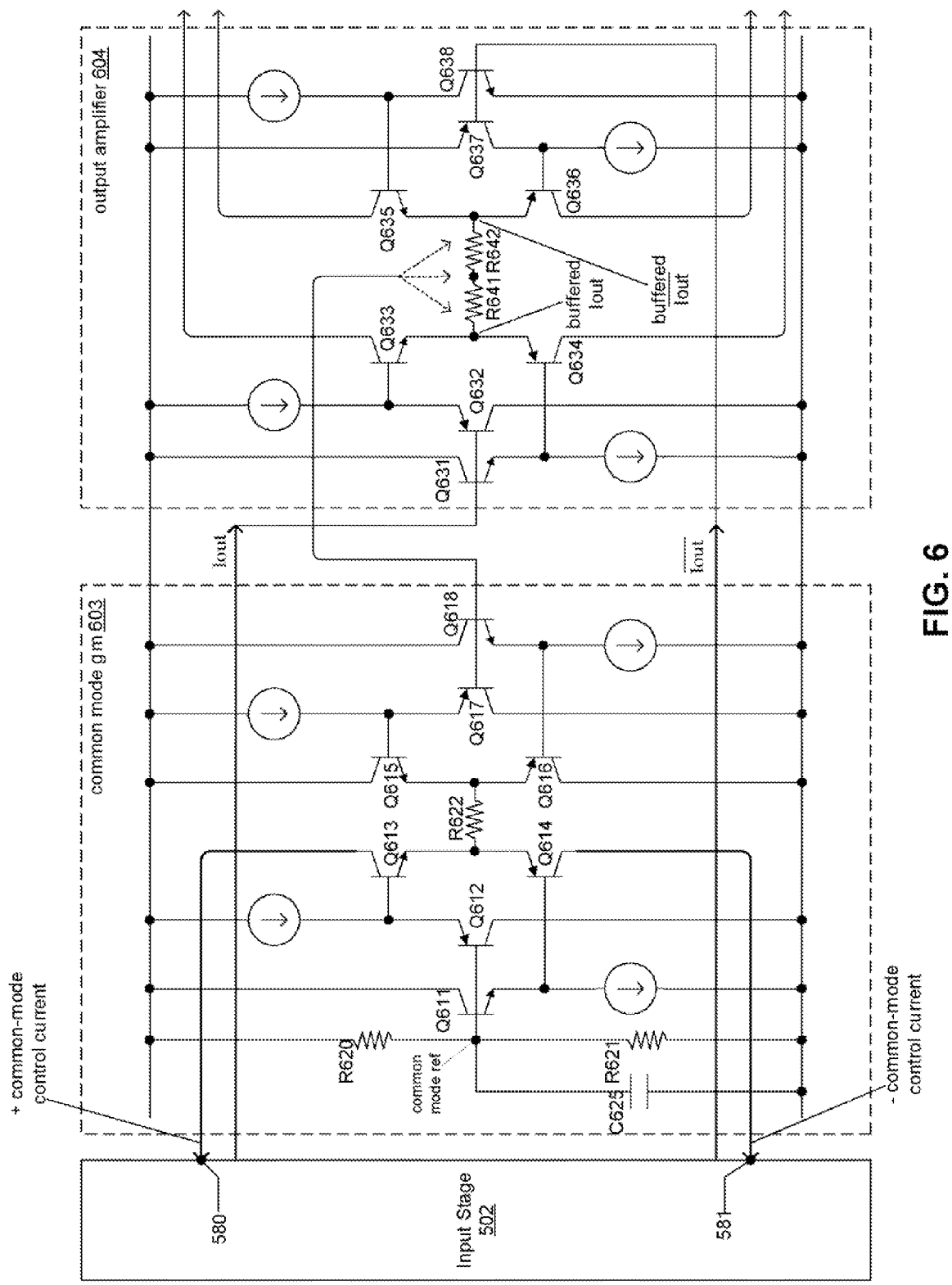
FIG. 6 is a circuit diagram of a common-mode control operation amplifier.

The + and − common-mode control currents can be produced by a common-mode transconductance stage, an example of which is shown at 603 in FIG. 6. Such a common-mode transconductance stage provides the +common-mode control current and the − common-mode control current in response to a monitoring of the common-mode voltage of Iout and Iout_bar so as to bring their common-mode voltage to agree with a common-mode reference. The common-mode transconductance stage 603 is shown as including transistors Q611-Q618, resistors R620-622, a capacitor C625, and a few current sources. The resistors R620 and R621, which form a voltage divider, are shown as producing a common-mode reference voltage. The capacitor C625 attenuates supply noise within the voltage divider. FIG. 6 shows just one example of a common-mode transconductance stage. Alternative common-mode transconductance stages (i.e., besides 603) are known and are also within the scope of the present invention. FIG. 6 also shows an exemplary output amplifier 604, which includes transistors Q631-Q638, resistors R641-R642, and a few current sources. Alternative output amplifiers (i.e., besides 604) are known and are also within the scope of the present invention.

The input stages of FIGS. 2-5 achieve input common-mode compliance toward ground, while retaining slew-enhancing transient capability. The input stages of FIGS. 4 and 5 include npn-pnp and pnp-npn current mirrors, allowing the input signals to comply fully to ground. The input stage of FIG. 5 achieves common-mode control currents that do not create differential errors. This is achieve, in part, by the providing dynamic bias currents for the emitter-followers in the input stage of FIG. 5.

FIG. 6 shows an operation amplifier with some details of a common-mode control amplifier 603 interfacing the control nodes 580 and 581 of the input stage 502. In this example, the differential Iout and Iout_bar lines from the input stage circuit 502 drive the inputs of an extract of an output amplifier 604. The output amplifier 604 will have input buffers that copy the Iout voltages, to maintain high gain at the Iout and Iout_bar nodes. These buffered voltages are applied to a resistor pair that establishes the common-mode replica of Iout. This common-mode value is applied to the differential and complementary Gm amplifier 603 in the center of FIG. 6. It compares that Iout common-mode replica to a bias point (shown as the common-mode reference), which can be, e.g., mid-supply voltage, and outputs the + and − common-mode control currents. Note that the pickoff point for the buffered Iout common-mode voltage can be on buffered Iout_bar, buffered Iout, or by a resistor tap in between.

Figure 7:
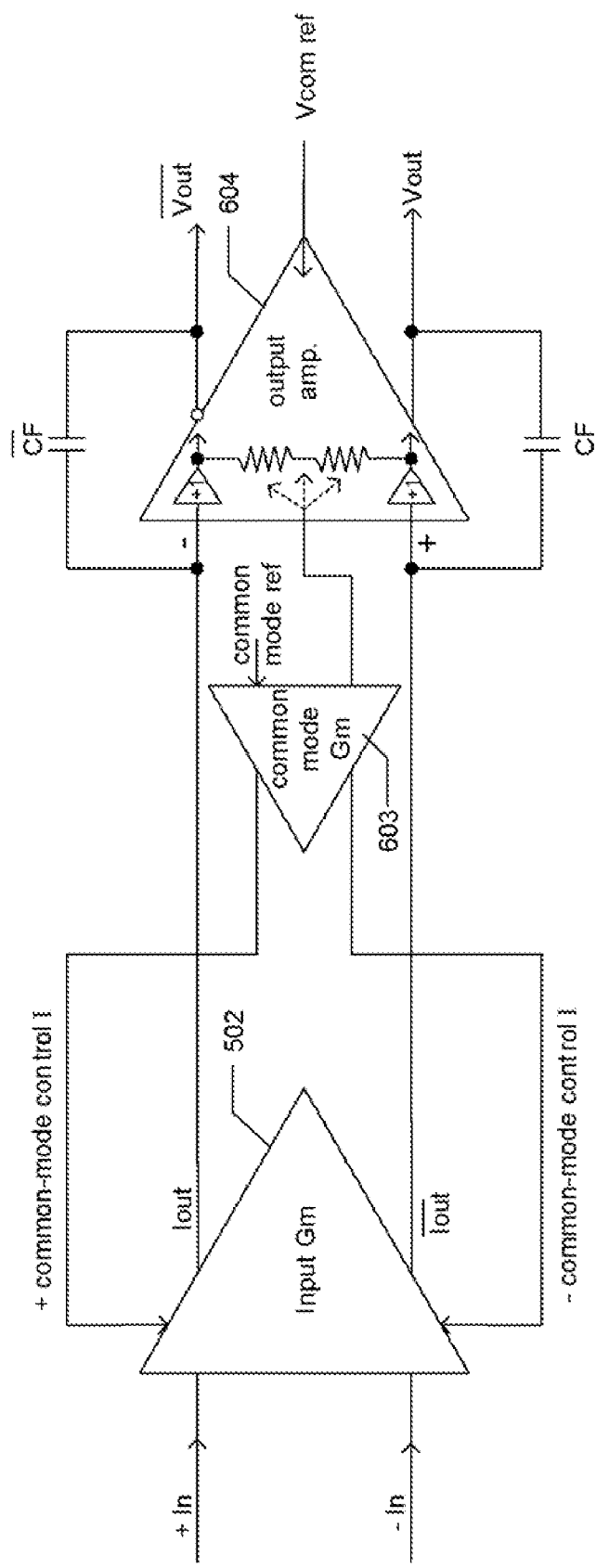
FIG. 7 is a diagram of a fully differential input/output operation amplifier.

FIG. 7 shows an exemplary assembly of an operation amplifier with the input stage 502, common-mode control 603, and a differential output stage 604. Differential output stages have their own mechanisms for establishing the output common-mode level, usually with an external output common-mode reference voltage Vcom_ref. The output stage with its feedback capacitors (CF) serves as an integrator, and the gain-bandwidth product of the overall amplifier is Gm,input/(2 pi*CF).

The output amplifier 604 can also have buffers that accept the input stage's output currents Iout and Iout_bar, and internal common-mode feedback levels are available to the common-mode control amplifier 603, as shown in FIG. 6. In this approach transients at the input cause differential response currents from the output currents Iout and Iout_bar, but the common-mode current of the output currents Iout and Iout_bar does not have much signal content. The Iout transient currents flow through the feedback capacitors (CF), and the outputs have differential but not common-mode transients. The common-mode amplifier 603 mainly outputs static control currents.

Figure 8:
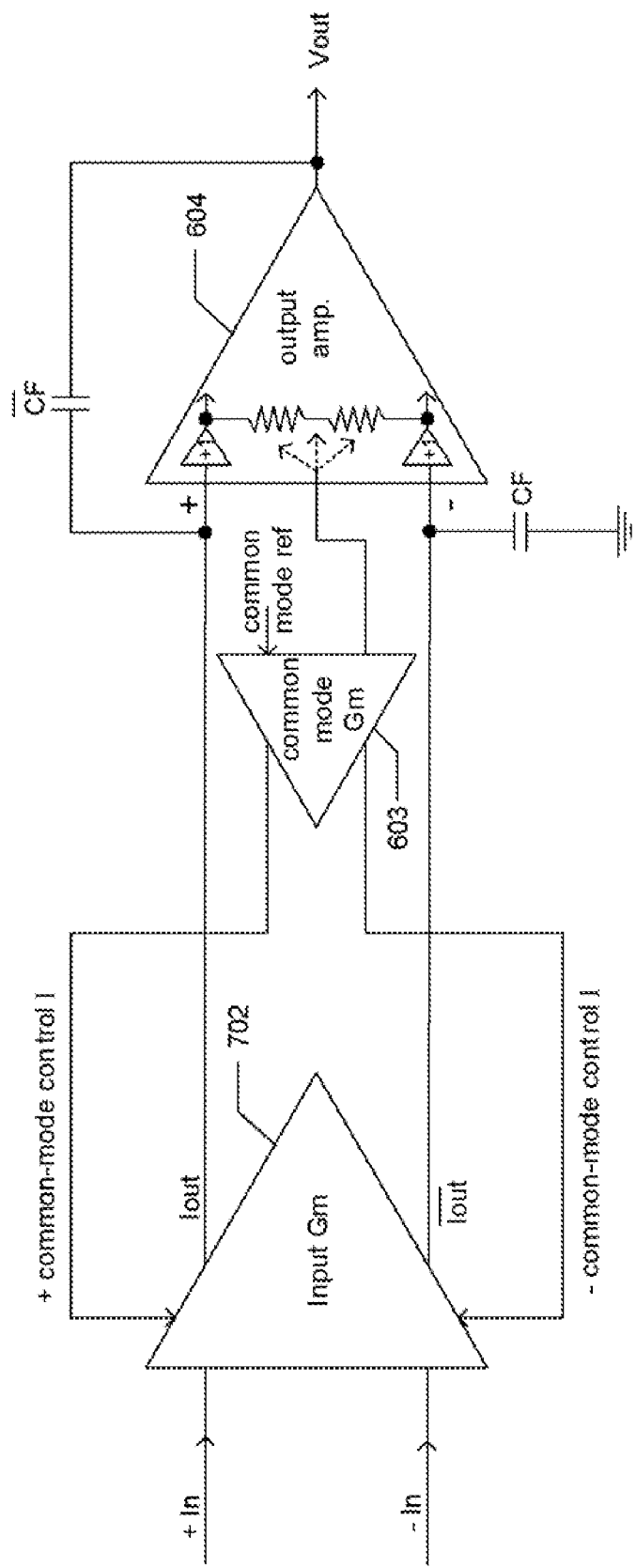
FIG. 8 is a diagram of differential input, single-ended output operation amplifier.

FIG. 8 shows a single-ended output stage operation amplifier. Operation is generally the same as in FIG. 7, but the capacitor to ground has a common-mode transient. The output amplifier 604 acts transiently as a follower due to the feedback capacitor, and ultimately the −input of the output amplifier follows this common-mode transient. In this circuit, the common-mode Gm 603 attempts to suppress this common-mode signal by outputting transients on its common-mode control current lines. This amplifier can perform differential to single-ended conversion by suppressing as much common-mode variation as it can on the Iout lines.

Figure 9:
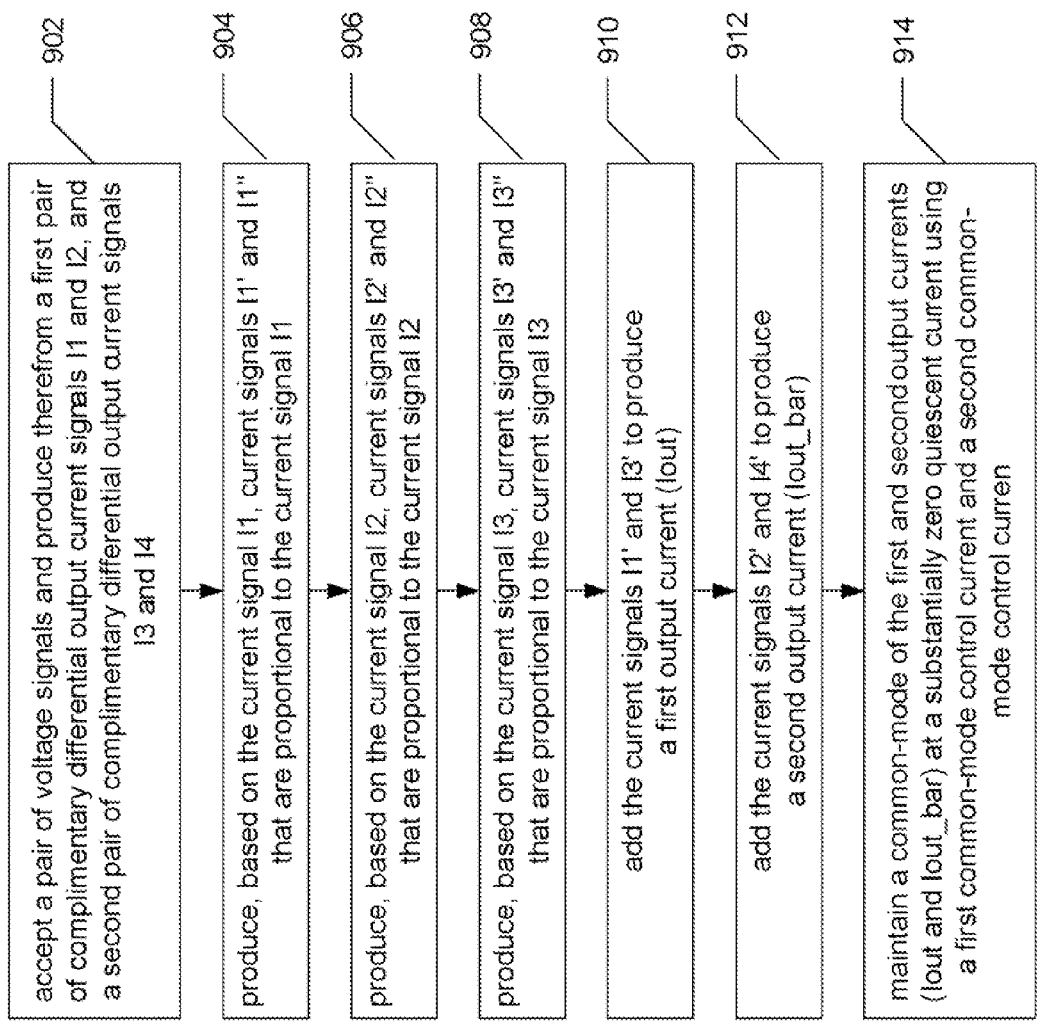
FIG. 9 is a high level flow diagram that is used to summarize methods according to certain embodiments of the present invention.

FIG. 9 is a high level flow diagram that is used to summarize methods according to certain embodiments of the present invention. The steps 902-914 of FIG. 9 can be implemented using the circuitry described above in FIGS. 5-8, but is not limited thereto.

The foregoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed:

1. An input stage, comprising:
   a complimentary differential input transconductor including
      a pair of differential inputs that accept a pair of voltage signals;
      a first pair of complimentary differential outputs that output current signals I1 and I2; and
      a second pair of complimentary differential outputs that output current signals I3 and I4;
   a first npn-pnp current mirror having an input and a pair of outputs, the input accepting the current signal I1, and the pair of outputs outputting current signals I1' and I1" that are proportional to the current signal I1;
   a second npn-pnp current mirror having an input and a pair of outputs, the input accepting the current signal I2, and the pair of outputs outputting current signals I2' and I2" that are proportional to the current signal I2;
   a first pnp-npn current mirror having an input and a pair of outputs, the input accepting the current signal I3, and the pair of outputs outputting current signals I3' and I3" that are proportional to the current signal I3; and
   a second pnp-npn current mirror having an input and a pair of outputs, the input accepting the current signal I4, and the outputs outputting current signals I4' and I4" that are proportional to the current signal I4;
   wherein the current signals I1' and I3' are added to produce a first output current (Iout) of the input stage; and
   wherein the current signals I2' and I4' are added to produce a second output current (Iout_bar) of the input stage.

2. The input stage of claim 1, wherein to reduce non-linearities between the npn-pnp current mirrors and the pnp-npn current mirrors:
   the current signals I1" and I2" output by the first and second npn-pnp current mirrors are provided to the second and first pnp-npn current mirrors; and
   the current signals I3" and I4" output by the first and second pnp-npn current mirrors are provided to the second and first npn-pnp current mirrors.

3. The input stage of claim 1, wherein:
   the first and second npn-pnp current mirrors each includes a npn emitter-follower transistor having a base that forms the input of the current mirror, a collector connected to a high voltage rail, and an emitter connected to bases of two pnp output transistors, with collectors of the two pnp output transistors forming the pair of outputs of the npn-pnp current mirrors; and
   the first and second pnp-npn current mirrors each includes a pnp emitter-follower transistor having a base that forms the input of the current mirror, a collector connected to a low voltage rail, and an emitter connected to bases of two npn output transistors, with collectors of the two npn output transistors forming the pair of outputs of the pnp-npn current mirrors.

4. The input stage of claim 3, wherein:
   the current signal I1", output by one of the outputs of the first npn-pnp current mirror, is provided to the emitter of the pnp transistor whose base forms the input of the second pnp-npn current mirror;
   the current signal I2", output by one of the outputs of the second npn-pnp current mirror, is provided to the emitter of the pnp transistor whose base forms the input of the first pnp-npn current mirror;

the current signal I3", output by one of the outputs of the first pnp-npn current mirror, is provided to the emitter of the npn transistor whose base forms the input of the second npn-pnp current mirror; and the current signal I4", output by one of the outputs of the second pnp-npn current mirror, is provided to the emitter of the npn transistor whose base forms the input of the first npn-pnp current mirror.

5. The input stage of claim 4, further comprising:
a first resistor having a first terminal connected to the high voltage rail and having a second terminal;
a second resistor having a first terminal connected to the low voltage rail and having a second terminal;
wherein the first npn-pnp current mirror includes a resistor connected between the second terminal of the first resistor and the base of the npn transistor that forms the input of the first npn-pnp current mirror;
wherein the second npn-pnp current mirror includes a resistor connected between the second terminal of the first resistor and the base of the npn transistor that forms the input of the second npn-pnp current mirror;
wherein the first pnp-npn current mirror includes a resistor connected between the second terminal of the second resistor and the base of the pnp transistor that forms the input of the first pnp-npn current mirror; and
wherein the second pnp-npn current mirror includes a resistor connected between the second terminal of the second resistor and the base of the pnp transistor that forms the input of the second pnp-npn current mirror.

6. The input stage of claim 5, wherein:
a first common-mode control current is provided to the second terminal of the first resistor to increase in tandem sourcing magnitudes of the first and second output currents (Iout and Iout_bar) of the input stage; and
a second common-mode control current is provided to the second terminal of the second resistor to increase in tandem sinking magnitudes of the first and second output currents (Iout and Iout_bar) of the input stage.

7. The input stage of claim 6, wherein:
the first and second common-mode control currents are produced by a common-mode transconductance stage that provides the first and second common-mode control currents to the input stage in response to a monitoring of the common-mode voltage, determined based on the first and second output currents (Iout and Iout_bar) of the input stage, to adjust the common-mode voltage to substantially equal a common-mode reference voltage.

8. The input stage of claim 5, wherein:
a first common-mode control current is provided to the second terminal of the first resistor, and a second common-mode control current is provided to the second terminal of the second resistor, to maintain a common-mode of the first and second output currents (Iout and Iout_bar) at a substantially zero quiescent current.

9. An operation-amplifier, comprising:
an input stage;
a common-mode transconductance stage; and
an output stage;
wherein the input stage comprises:
a complimentary differential input transconductor including
a pair of differential inputs that accept a pair of voltage signals;
a first pair of complimentary differential outputs that output current signals I1 and I2; and
a second pair of complimentary differential outputs that output current signals I3 and I4;
a first npn-pnp current mirror having an input and a pair of outputs, the input accepting the current signal I1, and the pair of outputs outputting current signals I1' and I1" that are proportional to the current signal I1;
a second npn-pnp current mirror having an input and a pair of outputs, the input accepting the current signal I2, and the pair of outputs outputting current signals I2' and I2" that are proportional to the current signal I2;
a first pnp-npn current mirror having an input and a pair of outputs, the input accepting the current signal I3, and the pair of outputs outputting current signals I3' and I3" that are proportional to the current signal I3; and
a second pnp-npn current mirror having an input and a pair of outputs, the input accepting the current signal I4, and the outputs outputting current signals I4' and I4" that are proportional to the current signal I4;
wherein the current signals I1' and I3' are added to produce a first output current (Iout) of the input stage;
wherein the current signals I2' and I4' are added to produce the second output current (Iout_bar) of the input stage;
wherein the output stage receives the first and second output currents (Iout and Iout_bar) of the input stage and based thereon determines a common-mode voltage; and
wherein the common-mode transconductance stage produces and provides first and second common-mode control currents to the input stage to adjust the common-mode voltage to substantially equal the common-mode reference voltage.

10. The operation-amplifier of claim 9, wherein:
the first common-mode control current is provided to the second terminal of the first resistor to increase in tandem sourcing magnitudes of the first and second output currents (Iout and Iout_bar) of the input stage; and
the second common-mode control current is provided to the second terminal of the second resistor to increase in tandem sinking magnitudes of the first and second output currents (Iout and Iout_bar) of the input stage.

11. The operation-amplifier of claim 10, wherein:
the current signals I1" and I2" output by the first and second npn-pnp current mirrors are provided to the second and first pnp-npn current mirrors; and
the current signals I3" and I4" output by the first and second pnp-npn current mirrors are provided to the second and first npn-pnp current mirrors.

12. The operation-amplifier of claim 11, wherein:
the first and second npn-pnp current mirrors each includes a npn emitter-follower transistor having a base that forms the input of the current mirror, a collector connected to a high voltage rail, and an emitter connected to bases of two pnp output transistors, with collectors of the two pnp output transistors forming the pair of outputs of the npn-pnp current mirrors; and
the first and second pnp-npn current mirrors each includes a pnp emitter-follower transistor having a base that forms the input of the current mirror, a collector connected to a low voltage rail, and an emitter connected to bases of two npn output transistors, with collectors of the two npn output transistors forming the pair of outputs of the pnp-npn current mirrors.

13. The operation-amplifier of claim 12, wherein:
the current signal I1", output by one of the outputs of the first npn-pnp current mirror, is provided to the emitter of the pnp transistor whose base forms the input of the second pnp-npn current mirror;

the current signal I2", output by one of the outputs of the second npn-pnp current mirror, is provided to the emitter of the pnp transistor whose base forms the input of the first pnp-npn current mirror;

the current signal I3", output by one of the outputs of the first pnp-npn current mirror, is provided to the emitter of the npn transistor whose base forms the input of the second npn-pnp current mirror; and the current signal I4", output by one of the outputs of the second pnp-npn current mirror, is provided to the emitter of the npn transistor whose base forms the input of the first npn-pnp current mirror.

14. The operation-amplifier of claim 13, wherein the input stage also comprises:

a first resistor having a first terminal connected to the high voltage rail and having a second terminal; and a second resistor having a first terminal connected to the low voltage rail and having a second terminal;

wherein the first npn-pnp current mirror includes a resistor connected between the second terminal of the first resistor and the base of the npn transistor that forms the input of the first npn-pnp current mirror;

wherein the second npn-pnp current mirror includes a resistor) connected between the second terminal of the first resistor and the base of the npn transistor that forms the input of the second npn-pnp current mirror;

wherein the first pnp-npn current mirror includes a resistor connected between the second terminal of the second resistor and the base of the pnp transistor that forms the input of the first pnp-npn current mirror; and wherein the second pnp-npn current mirror includes a resistor connected between the second terminal of the second resistor and the base of the pnp transistor that forms the input of the second pnp-npn current mirror.

15. The operation-amplifier of claim 14, wherein:

the first common-mode control current is provided to the second terminal of the first resistor; and the second common-mode control current is provided to the second terminal of the second resistor.

16. A method for producing differential current signals based on a pair of voltage signals, comprising:

accepting a pair of voltage signals and producing therefrom a first pair of complimentary differential output current signals I1 and I2, and a second pair of complimentary differential output current signals I3 and I4;

producing, based on the current signal I1, current signals I1' and I1" that are proportional to the current signal I1;

producing, based on the current signal I2, current signals I2' and I2" that are proportional to the current signal I2;

producing, based on the current signal I3, current signals I3' and I3" that are proportional to the current signal I3;

producing, based on the current signal I3, current signals I3' and I3" that are proportional to the current signal I3;

adding the current signals I1' and I3' to produce a first output current (Iout); and adding the current signals I2' and I4' to produce a second output current (Iout_bar).

17. The method of claim 16, further comprising:

increasing in tandem sourcing magnitudes of the first and second output currents (Iout and Iout_bar) in response to a first common-mode control current; and increasing in tandem sinking magnitudes of the first and second output currents (Iout and Iout_bar) in response to a second common-mode control current.

18. The method of claim 17, further comprising:

producing, based on the first and second output currents (Iout and Iout_bar), a common-mode voltage; and adjusting the common-mode voltage to substantially equal a common-mode reference voltage using the first and second common-mode control currents.

19. The method of claim 16, further comprising:

maintaining a common-mode of the first and second output currents (Iout and Iout_bar) at a substantially zero quiescent current using a first common-mode control current and a second common-mode control current.

* * * * *